US011175572B2

(12) United States Patent
Nakashima

(10) Patent No.: US 11,175,572 B2
(45) Date of Patent: Nov. 16, 2021

(54) LIGHT EMITTING DEVICE AND PROJECTOR

(71) Applicant: Seiko Epson Corporation, Tokyo (JP)

(72) Inventor: Yoshiki Nakashima, Suwa (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 17/034,120

(22) Filed: Sep. 28, 2020

(65) Prior Publication Data

US 2021/0096451 A1    Apr. 1, 2021

(30) Foreign Application Priority Data

Sep. 30, 2019  (JP) .............................. JP2019-178863

(51) Int. Cl.
| G02B 21/20 | (2006.01) |
| H01L 33/38 | (2010.01) |
| H04N 9/31 | (2006.01) |
| G03B 21/20 | (2006.01) |

(52) U.S. Cl.
CPC ........ *G03B 21/2033* (2013.01); *H01L 33/382* (2013.01); *H04N 9/3161* (2013.01)

(58) Field of Classification Search
CPC ..... H01L 33/0045; H01L 33/10; H01L 33/20; H01L 33/38; H01L 33/382; G02B 26/0816; G02B 26/101; G03B 21/14; G09G 3/025; H04N 9/31; H04N 9/3161
See application file for complete search history.

(56) References Cited

U.S. PATENT DOCUMENTS

| 2009/0074026 | A1 | 3/2009 | Nagatomo et al. |
| 2010/0187554 | A1* | 7/2010 | Jang .................. H01L 33/20 257/98 |
| 2010/0246625 | A1 | 9/2010 | Kawashima et al. |
| 2012/0175632 | A1* | 7/2012 | Cho .................. H01L 33/20 257/76 |
| 2020/0274330 | A1* | 8/2020 | Nagawa ................. H01S 5/11 |
| 2021/0126434 | A1* | 4/2021 | Jiroku .................. H01L 33/18 |

FOREIGN PATENT DOCUMENTS

| JP | 2009-043918 A | 2/2009 |
| JP | 2010-232488 A | 10/2010 |
| JP | 2019-040982 A | 3/2019 |

\* cited by examiner

*Primary Examiner* — William C. Dowling
(74) *Attorney, Agent, or Firm* — Harness, Dickey & Pierce, P.L.C.

(57) ABSTRACT

The light emitting device includes an excitation light source, and a light emitting light source, wherein the light emitting light source includes a substrate, a photonic crystal structure which is provided to the substrate and has a light emitting layer, and an electrode configured to inject an electrical current into the light emitting layer, the excitation light source irradiates the light emitting layer with excitation light, the light emitting layer generates light due to the electrical current injected from the electrode and the excitation light, and in the photonic crystal structure, the light emitted in the light emitting layer resonates in an in-plane direction of the substrate, and a laser beam is emitted in a normal direction of the substrate.

7 Claims, 4 Drawing Sheets

LIGHT EMITTING DEVICE AND PROJECTOR

The present application is based on, and claims priority from JP Application Serial Number 2019-178863, filed Sep. 30, 2019, the disclosure of which is hereby incorporated by reference herein in its entirety.

BACKGROUND

1. Technical Field

The present disclosure relates to a light emitting device and a projector.

2. Related Art

Semiconductor lasers are promising as high-luminance next-generation light sources. In particular, the semiconductor laser having a nano-structure called a nano-column, a nano-wire, a nano-rod, a nano-pillar, or the like is expected to realize a light emitting device capable of obtaining narrow-radiation angle and high-power light emission due to an effect of a photonic crystal.

In JP-A-2009-43918, there are disclosed a structure and a surface emitting laser provided with the structure, wherein the structure is provided with a configuration which has a two-dimensional photonic crystal having configurations different in refractive index from each other and arranged at a two-dimensional pitch, and emits light propagating in an in-plane direction of the two-dimensional photonic crystal in a direction perpendicular to a resonant direction of the light.

In the semiconductor laser provided with the photonic crystal structure, by increasing an amount of the injection current, there occurs the population inversion, and it is possible to cause the laser oscillation. However, when increasing the amount of the injection current, the characteristics of the semiconductor laser are affected by the heat generated by the semiconductor laser in some cases.

SUMMARY

A light emitting device according to an aspect of the present disclosure includes an excitation light source, and a light emitting light source, wherein the light emitting light source includes a substrate, a photonic crystal structure which is provided to the substrate and has a light emitting layer, and an electrode configured to inject an electrical current into the light emitting layer, the excitation light source irradiates the light emitting layer with excitation light, the light emitting layer generates light due to the electrical current injected from the electrode and the excitation light, and in the photonic crystal structure, the light emitted in the light emitting layer resonates in an in-plane direction of the substrate, and a laser beam is emitted in a normal direction of the substrate.

In the light emitting device according to the above aspect, the excitation light source may irradiate a surface at an opposite side of the substrate to a side to which the photonic crystal structure is provided with the excitation light, and the light emitting layer may be irradiated with the excitation light transmitted through the substrate.

In the light emitting device according to the above aspect, a light axis of the excitation light entering the light emitting layer and a light axis of the laser beam may be parallel to each other.

In the light emitting device according to the above aspect, there may further be included a wavelength-selective film which is configured to transmit the excitation light and reflect the laser beam, and is disposed between the photonic crystal structure and the excitation light source.

In the light emitting device according to the above aspect, a wavelength of the excitation light and a wavelength of the laser beam may be the same as each other.

In the light emitting device according to the above aspect, a wavelength of the excitation light and a wavelength of the laser beam may be different from each other.

A projector according to another aspect of the present disclosure includes the light emitting device described above.

DESCRIPTION OF EXEMPLARY EMBODIMENTS

Some preferred embodiments of the present disclosure will hereinafter be described in detail using the drawings. It should be noted that the embodiments described hereinafter do not unreasonably limit the contents of the present disclosure as set forth in the appended claims. Further, all of the constituents described hereinafter are not necessarily essential elements of the present disclosure.

1. First Embodiment

1.1. Configuration of Light Emitting Device

Figure 1:
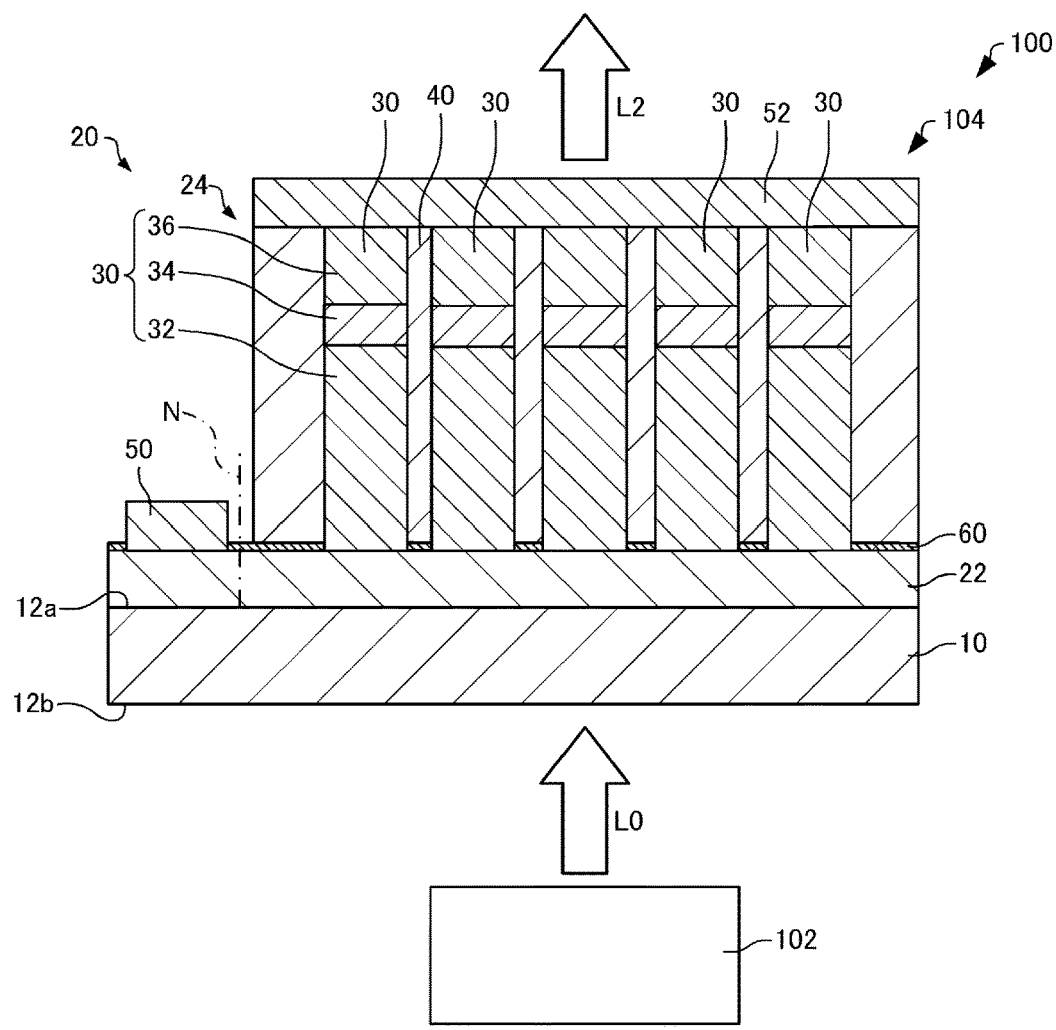
FIG. 1 is a cross-sectional view schematically showing a light emitting device according to a first embodiment.

Firstly, a light emitting device according to a first embodiment will be described with reference to the drawings. FIG. 1 is a cross-sectional view schematically showing the light emitting device 100 according to the first embodiment.

As shown in FIG. 1, the light emitting device 100 has an excitation light source 102, and a light emitting light source 104. The excitation light source 102 emits excitation light L0, and the light emitting light source 104 emits a laser beam L2 as irradiation light.

The light emitting light source 104 has a substrate 10, a stacked body 20, a first electrode 50, and a second electrode 52.

The substrate 10 has, for example, a plate-like shape. The substrate 10 transmits the excitation light L0. In other words, the substrate 10 is formed of a material transparent with respect to the excitation light L0 emitted from the excitation light source 102. The substrate 10 is, for example, a GaN substrate, a sapphire substrate, or a glass substrate.

The substrate 10 has a first surface 12a, and a second surface 12b located at the opposite side to the first surface 12a. The first surface 12a and the second surface 12b are each a flat surface. On the first surface 12a, there is disposed the stacked body 20. The first surface 12a is a surface located on the side on which a photonic crystal structure 24 is disposed.

The stacked body 20 is provided to the substrate 10. The stacked body 20 is disposed on the first surface 12a of the substrate 10. The stacked body 20 has a buffer layer 22 and the photonic crystal structure 24.

It should be noted that in the present specification, when taking a light emitting layer 34 as a reference in the stacking direction (hereinafter also referred to simply as a "stacking direction") of the stacked body 20, the description will be presented assuming a direction from the light emitting layer 34 toward the second semiconductor layer 36 as an "upward direction," and a direction from the light emitting layer 34 toward a first semiconductor layer 32 as a "downward direction." Further, the "stacking direction of the stacked body" denotes a stacking direction of the first semiconductor layer 32 and the light emitting layer 34.

The buffer layer 22 is disposed on the substrate 10. The buffer layer 22 is, for example, an Si-doped n-type GaN layer. On the buffer layer 22, there is disposed a mask layer 60 for forming columnar parts 30. The mask layer 60 is, for example, a titanium layer, a titanium oxide layer, a silicon oxide layer, or an aluminum oxide layer.

The photonic crystal structure 24 has the plurality of columnar parts 30 and a light propagation layer 40. The photonic crystal structure 24 is a structure having the refractive index varied with a period equal to or shorter than the wavelength of the light. In the illustrated example, the photonic crystal structure 24 is provided with the plurality of columnar parts 30 to thereby vary the refractive index with the period equal to or shorter than the wavelength of the light. Due to the effect of the photonic crystal structure 24, it is possible to resonate the light generated in the light emitting layer in an in-plane direction of the substrate 10. Further, due to the effect of the photonic crystal structure 24, it is possible to emit the laser beam L2 in a normal direction of the substrate 10.

It should be noted that in the illustrated example, the in-plane direction of the substrate 10 corresponds to the in-plane direction of the first surface 12a of the substrate 10, and is a direction perpendicular to the normal line N of the first surface 12a of the substrate 10. Further, in the illustrated example, the normal direction of the substrate 10 corresponds to a direction along the normal line N of the first surface 12a of the substrate 10, and is the same direction as the stacking direction.

The columnar parts 30 are disposed on the buffer layer 22. The columnar parts 30 are disposed between the substrate 10 and the second electrode 52. The columnar parts 30 each have a columnar shape protruding upward from the buffer layer 22. The planar shape of the columnar part 30 is, for example, a polygonal shape or a circle. The diametrical size of the columnar part 30 is in a nanometer-order range, and is, for example, not smaller than 10 nm and not larger than 500 nm. The columnar part 30 is also referred to as, for example, a nano-column, a nano-wire, a nano-rod, or a nano-pillar.

It should be noted that when the planar shape of the columnar part 30 is a circle, the "diametrical size of the columnar part" means the diameter of the circle, and when the planar shape of the columnar part 30 is not a circular shape, the "diametrical size of the columnar part" means the diameter of the minimum enclosing circle. For example, when the planar shape of the columnar part 30 is a polygonal shape, the diametrical size of the columnar part 30 is the diameter of a minimum circle including the polygonal shape inside, and when the planar shape of the columnar part 30 is an ellipse, the diametrical size of the columnar part 30 is the diameter of a minimum circle including the ellipse inside.

The number of the columnar parts 30 disposed is more than one. An interval between the columnar parts 30 adjacent to each other is, for example, not smaller than 1 nm and not larger than 500 nm. The columnar parts 30 are arranged at a predetermined pitch in a predetermined direction in a plan view (hereinafter also referred to simply as "in the plan view") viewed from the stacking direction. The plurality of columnar parts 30 is disposed so as to form, for example, a triangular lattice or a quadrangular lattice. The plurality of columnar parts 30 can develop an effect of a photonic crystal.

It should be noted that the "pitch of the columnar parts 30" is a distance between the centers of the columnar parts 30 adjacent to each other along the predetermined direction. When the planar shape of the columnar part 30 is a circle, the "center of the columnar part 30" means the center of the circle, and when the planar shape of the columnar part 30 is not a circular shape, the "center of the columnar part 30" means the center of the minimum enclosing circle. For example, when the planar shape of the columnar part 30 is a polygonal shape, the center of the columnar part 30 is the center of a minimum circle including the polygonal shape inside, and when the planar shape of the columnar part 30 is an ellipse, the center of the columnar part 30 is the center of a minimum circle including the ellipse inside.

The columnar parts 30 each have the first semiconductor layer 32, the light emitting layer 34, and the second semiconductor layer 36.

The first semiconductor layer 32 is disposed on the buffer layer 22. The first semiconductor layer 32 is disposed between the substrate 10 and the light emitting layer 34. The first semiconductor layer 32 is an n-type semiconductor layer. The first semiconductor layer 32 is, for example, an Si-doped n-type GaN layer.

The light emitting layer 34 is disposed on the first semiconductor layer 32. The light emitting layer 34 is disposed between the first semiconductor layer 32 and the second semiconductor layers 36. The light emitting layer 34 generates light in response to injection of an electrical current. The light emitting layer 34 has a multiple quantum well structure obtained by stacking quantum well structures each constituted by, for example, an i-type GaN layer doped with no impurity and an i-type InGaN layer.

The second semiconductor layer 36 is disposed on the light emitting layer 34. The second semiconductor layer 36 is a layer different in conductivity type from the first semiconductor layer 32. The second semiconductor layer 36 is a p-type semiconductor layer. The second semiconductor layer 36 is, for example, an Mg-doped p-type GaN layer. The first semiconductor layer 32 and the second semiconductor layer 36 are cladding layers having a function of confining the light in the light emitting layer 34.

The light propagation layer 40 is disposed between the columnar parts 30 adjacent to each other. The light propagation layer 40 is disposed on the mask layer 60. The light propagation layer 40 surrounds the columnar parts 30 in the plan view. The refractive index of the light propagation layer 40 is lower than, for example, the refractive index of the light emitting layer 34. The light propagation layer 40 is, for example, a silicon oxide layer, an aluminum oxide layer, or a titanium oxide layer. The light generated in the light emitting layer 34 can pass through the light propagation layer 40 to propagate in the in-plane direction of the substrate 10. It should be noted that an air gap can be disposed between the columnar parts 30 adjacent to each other although not shown in the drawings.

The first electrode 50 is disposed on the buffer layer 22. It is also possible for the buffer layer 22 to have ohmic contact with the first electrode 50. The first electrode 50 is electrically coupled to the first semiconductor layer 32. In the illustrated example, the first electrode 50 is electrically coupled to the first semiconductor layer 32 via the buffer layer 22. The first electrode 50 is one of the electrodes for injecting the electrical current into the light emitting layer 34. As the first electrode 50, there is used, for example, what is obtained by stacking a Ti layer, an Al layer, and an Au layer in this order from the buffer layer 22 side.

The second electrode 52 is disposed at the opposite side to the substrate 10 side of the stacked body 20. In the illustrated example, the second electrode 52 is disposed on the second semiconductor layer 36 and the light propagation layer 40. It is also possible for the second semiconductor layer 36 to have ohmic contact with the second electrode 52. The second electrode 52 is electrically coupled to the second semiconductor layer 36. The second electrode 52 is the other of the electrodes for injecting the electrical current into the light emitting layer 34. The second electrode 52 is a transparent electrode. As the second electrode 52, there is used, for example, ITO (indium tin oxide).

It should be noted that although not shown in the drawings, a contact layer can also be disposed between the second semiconductor layer 36 and the second electrode 52. It is also possible for the contact layer to have ohmic contact with the second electrode 52. The contact layer is, for example, a p-type GaN layer. The contact layer can be provided to each of the columnar parts 30 to constitute the columnar part 30, or can also be a continuous single layer straddling the plurality of columnar parts 30.

The excitation light source 102 irradiates the light emitting layer 34 with the excitation light L0. When the light emitting layer 34 is irradiated with the excitation light L0, the carriers are excited, and thus, it is possible to generate the light. In other words, the light emitting layer 34 generates the light due to the electrical current injected from the electrodes 50, 52 and the excitation light L0.

The excitation light source 102 is a semiconductor laser such as a surface emitting laser or an edge emitting laser. It should be noted that the excitation light source 102 is not limited in configuration providing the excitation light source 102 can emit the excitation light L0 capable of exciting the carriers in the light emitting layer 34.

The excitation light source 102 irradiates the second surface 12b of the substrate 10 with the excitation light L0. The excitation light L0 perpendicularly enters, for example, the second surface 12b of the substrate 10. The light emitting layer 34 is irradiated with the excitation light L0 having entered the substrate 10 and then transmitted through the substrate 10. The light axis of the excitation light L0 entering the light emitting layer 34 and the light axis of the laser beam L2 to be emitted from the photonic crystal structure 24 are, for example, parallel to each other. In other words, the excitation light L0 and the laser beam L2 proceed in the same direction. A part of the excitation light L0 is not absorbed by the light emitting layer 34 and so on, but passes through the stacked body 20, and is then emitted from the photonic crystal structure 24 together with the laser beam L2.

It should be noted that the light axis of the excitation light L0 means a light beam the highest in light intensity of the light beams emitted from the excitation light source 102. The light axis of the laser beam L2 means a light beam the highest in light intensity of the light beams emitted from the light emitting light source 104.

The wavelength of the excitation light L0 and the wavelength of the laser beam L2 are, for example, different from each other. Further, the color of the excitation light L0 and the color of the laser beam L2 are, for example, different from each other. For example, the excitation light L0 is blue, and the laser beam L2 is green. It should be noted that the color of the excitation light L0 and the color of the laser beam L2 can also be the same. When the color of the excitation light L0 and the color of the laser beam L2 are the same, the wavelength of the excitation light L0 and the wavelength of the laser beam L2 can be different from each other.

1.2. Operation of Light Emitting Device

In the light emitting light source 104, a pin diode is constituted by the p-type second semiconductor layer 36, the light emitting layer 34, and the n-type first semiconductor layer 32 in the columnar part 30. When applying a forward bias voltage of the pin diode between the first electrode 50 and the second electrode 52, the electrical current is injected into the light emitting layer 34, and recombination of electrons and holes occurs in the light emitting layer 34. The recombination causes light emission.

Further, the excitation light L0 emitted from the excitation light source 102 is transmitted through the substrate 10 and then enters the light emitting layer 34. By the light emitting layer 34 being irradiated with the excitation light L0, the carriers are excited in the light emitting layer 34 to cause the light emission.

In such a manner, in the light emitting layer 34, the light emission is caused by the electrical current injected from the electrodes 50, 52 and the excitation light L0.

The light generated in the light emitting layer 34 propagates in the in-plane direction of the substrate 10 through the light propagation layer 40 due to the first semiconductor layer 32 and the second semiconductor layer 36, resonates forming a standing wave due to the effect of the photonic crystal caused by the plurality of columnar parts 30, and then causes the laser oscillation with a gain in the light emitting layer 34. Then, positive first-order diffracted light and negative first-order diffracted light are emitted in the normal direction of the substrate 10 as the laser beam L2. On this occasion, a part of the excitation light L0 is not absorbed by the light emitting layer 34 and so on, but passes through the stacked body 20, and is then emitted together with the laser beam L2. In other words, the irradiation light emitted by the light emitting device 100 includes the laser beam L2 and the part of the excitation light L0.

1.3. Advantages

The light emitting device 100 has the excitation light source 102 and the light emitting light source 104, and the light emitting light source 104 has the substrate 10, the photonic crystal structure 24 which is provided to the substrate 10 and has the light emitting layer 34, and the electrodes 50, 52 for injecting the electrical current into the light emitting layer 34. Further, the excitation light source 102 irradiates the light emitting layer 34 with the excitation light L0, the light emitting layer 34 generates the light due to the electrical current injected from the electrodes 50, 52 and the excitation light L0, and in the photonic crystal structure 24, the light generated in the light emitting layer 34 resonates in the in-plane direction of the substrate 10, and thus, the laser beam L2 is emitted in the normal direction of the substrate 10.

As described above, in the light emitting device 100, since the light emitting layer 34 generates the light due to the electrical current injected from the electrodes 50, 52 and the excitation light L0, the amount of the injection current can be reduced compared to when generating the light due only to the electrical current injected from the electrodes 50, 52. Therefore, in the light emitting device 100, the heat generated while being activated can be reduced.

In the light emitting device 100, the excitation light source 102 irradiates the second surface 12b of the substrate 10 with the excitation light L0, and the light emitting layer 34 is irradiated with the excitation light L0 transmitted through the substrate 10. Therefore, in the light emitting device 100, the excitation light L0 which fails to be absorbed by the stacked body 20, but passes through the stacked body 20 can be emitted together with the laser beam L2. As described above, in the light emitting device 100, since excitation light L0 which fails to make a contribution to the light emission can be used as the irradiation light together with the laser beam L2, it is possible to efficiently increase the light intensity of the irradiation light.

In the light emitting device 100, the light axis of the excitation light L0 entering the light emitting layer 34 and the light axis of the laser beam L2 are parallel to each other. Therefore, in the light emitting device 100, it is possible to increase the light intensity of the irradiation light.

In the light emitting device 100, the wavelength of the excitation light L0 and the wavelength of the laser beam L2 are different from each other. Here, the excitation light L0 and the laser beam L2 are emitted from respective light sources different from each other, and the excitation light L0 and the laser beam L2 are different in phase from each other. Further, the wavelength of the excitation light L0 and the wavelength of the laser beam L2 are different from each other. Therefore, in the light emitting device 100, since the two types of light different in wavelength and phase from each other are emitted as the irradiation light, it is possible to reduce the speckle noise.

1.4. Manufacturing Method

Figure 2:
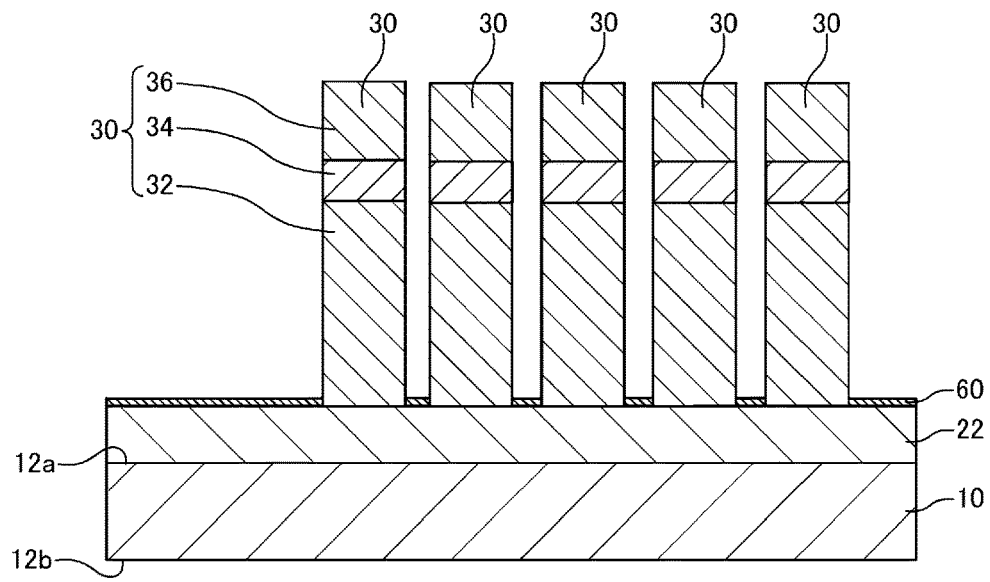
FIG. 2 is a cross-sectional view schematically showing a manufacturing process of the light emitting device according to the first embodiment.

Then, a method of manufacturing the light emitting device 100 according to the first embodiment will be described with reference to the drawings. FIG. 2 is a cross-sectional view schematically showing a manufacturing process of the light emitting device 100 according to the first embodiment.

As shown in FIG. 2, the buffer layer 22 is grown epitaxially on the substrate 10. As the method of achieving the epitaxial growth, there can be cited, for example, an MOCVD (Metal Organic Chemical Vapor Deposition) method and an MBE (Molecular Beam Epitaxy) method.

Then, the mask layer 60 is formed on the buffer layer 22. The mask layer 60 is formed by deposition using, for example, an electron beam deposition method or a plasma chemical vapor deposition (CVD) method, and patterning with a photolithography technique and an etching technique.

Then, the first semiconductor layer 32, the light emitting layer 34, and the second semiconductor layer 36 are grown epitaxally on the buffer layer 22 using the mask layer 60 as a mask. As the method of achieving the epitaxial growth, there can be cited, for example, the MOCVD method and the MBE method. Thus, the columnar parts 30 are formed.

As shown in FIG. 1, the light propagation layer 40 is formed on the mask layer 60. The light propagation layer 40 is formed using, for example, the MOCVD method or a spin coat method.

Then, the first electrode 50 is formed on the buffer layer 22, and the second electrode 52 is formed on the second semiconductor layer 36. The first electrode 50 and the second electrode 52 are formed using, for example, a vacuum deposition method. It should be noted that the order of forming the first electrode 50 and the second electrode 52 is not particularly limited.

Due to the process described hereinabove, it is possible to manufacture the light emitting light source 104.

Then, the excitation light source 102 is disposed so that the light emitting layer 34 of the light emitting light source 104 is irradiated with the excitation light L0.

Due to the process described hereinabove, it is possible to manufacture the light emitting device 100.

1.5. Modified Examples

Then, some modified examples of the light emitting device according to the first embodiment will be described. Hereinafter, differences from the example of the light emitting device 100 shown in FIG. 1 described above will be described, and the description of similarities will be omitted.

1.5.1. First Modified Example

Figure 3:
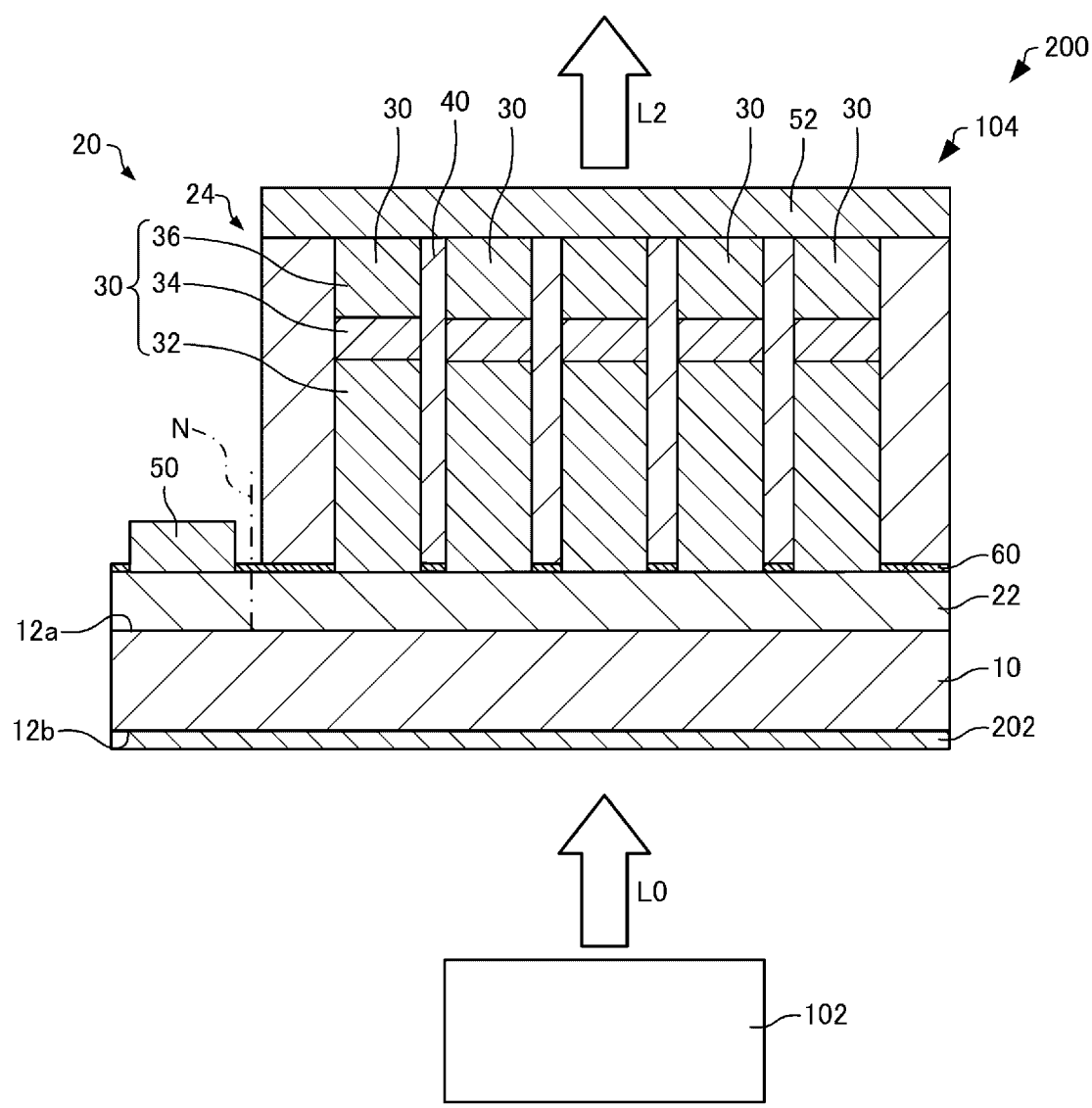
FIG. 3 is a cross-sectional view schematically showing a light emitting device according to a first modified example of the first embodiment.

FIG. 3 is a cross-sectional view schematically showing a light emitting device 200 according to a first modified example of the first embodiment. Hereinafter, in the light emitting device 200 according to the first modified example, members having the same functions as those of the constituent members of the light emitting device 100 described above will be denoted by the same reference symbols, and the detailed description thereof will be omitted.

As shown in FIG. 3, in the light emitting device 200, a wavelength-selective film 202 is disposed between the photonic crystal structure 24 and the excitation light source 102. In the example shown in FIG. 3, the wavelength-selective film 202 is disposed on the second surface 12b of the substrate 10.

The wavelength-selective film 202 transmits the excitation light L0, and at the same time, reflects the laser beam L2. The wavelength-selective film 202 is, for example, a DBR (Distributed Bragg Reflector) layer. In the light emitting device 200, by disposing the wavelength-selective film 202 between the photonic crystal structure 24 and the excitation light source 102, it is possible to reduce the leakage of the laser beam L2 to the substrate 10 side.

1.5.2. Second Modified Example

Figure 4:
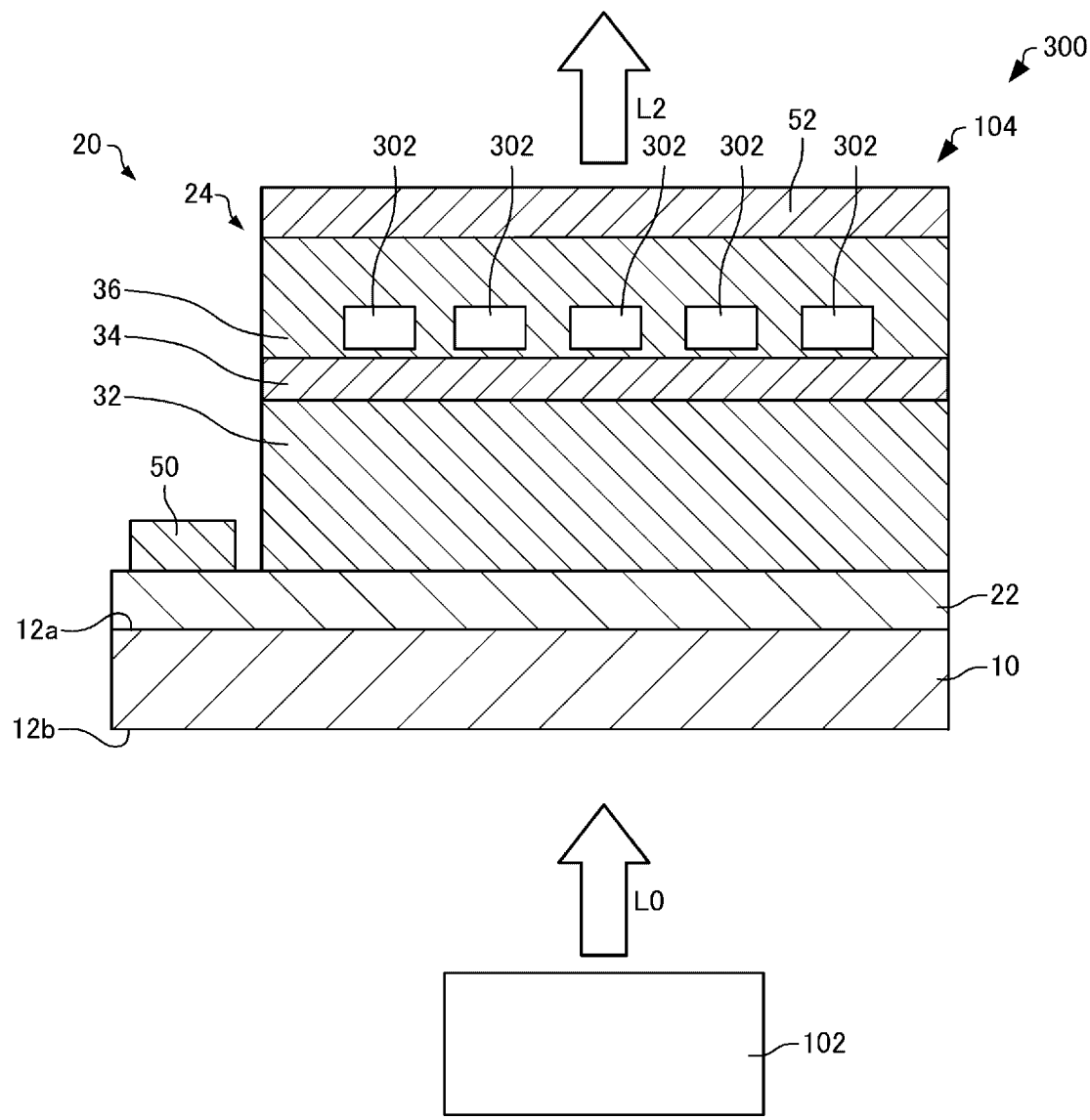
FIG. 4 is a cross-sectional view schematically showing a light emitting device according to a second modified example of the first embodiment.

FIG. 4 is a cross-sectional view schematically showing a light emitting device 300 according to a second modified example of the first embodiment. Hereinafter, in the light emitting device 300 according to the second modified example, members having the same functions as those of the constituent members of the light emitting device 100 described above will be denoted by the same reference symbols, and the detailed description thereof will be omitted.

As shown in FIG. 1, in the light emitting device 100 described above, the photonic crystal structure 24 varies the refractive index at the pitch equal to or shorter than the wavelength of the light using the plurality of columnar parts 30.

In contrast, in the light emitting device 300, the photonic crystal structure 24 varies the refractive index at the pitch equal to or shorter than the wavelength of the light using a plurality of opening parts 302. The photonic crystal structure 24 has the first semiconductor layer 32, the light emitting layer 34, and the second semiconductor layer 36 provided with the plurality of opening parts 302.

The opening parts 302 are provided to the second semiconductor layer 36. The opening parts 302 can each be a void, or can also be filled with a material different in refractive index from the second semiconductor layer 36. The opening parts 302 are arranged at a predetermined pitch in a predetermined direction in the plan view. The plurality of opening parts 302 is disposed so as to form, for example, a triangular lattice or a quadrangular lattice. The plurality of opening parts 302 can develop the effect of the photonic crystal.

It should be noted that although there is described here a case where the opening parts 302 are provided to the second semiconductor layer 36, it is also possible for the opening parts 302 to be provided to another layer than the second semiconductor layer 36 providing the opening parts 302 can develop the effect of the photonic crystal. For example, it is also possible to provide a photonic crystal layer for developing the effect of the photonic crystal in addition to the first semiconductor layer 32, the light emitting layer 34, and the second semiconductor layer 36.

In the light emitting device 300, it is possible to exert substantially the same functions and advantages as those of the light emitting device 100 described above.

1.5.3. Third Modified Example

Although in the light emitting device 100 described above, the wavelength of the excitation light L0 and the wavelength of the laser beam L2 are different from each other, the wavelength of the excitation light L0 and the wavelength of the laser beam L2 can be the same. Also in this case, since the phase of the excitation light L0 emitted from the excitation light source 102 and the phase of the laser beam L2 emitted from the light emitting device 100 are different from each other, the speckle noise can be reduced.

2. Second Embodiment

Figure 5:
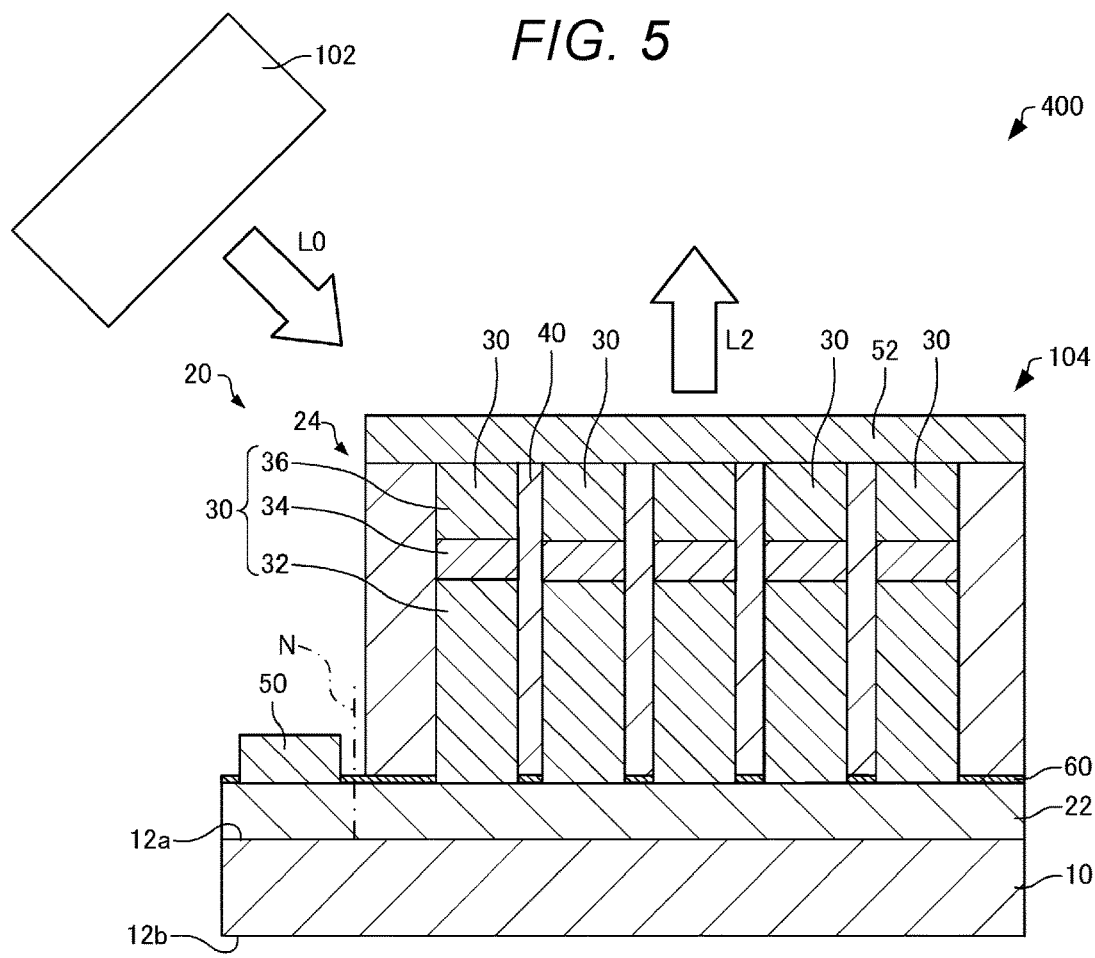
FIG. 5 is a cross-sectional view schematically showing a light emitting device according to a second embodiment.

Then, a light emitting device according to a second embodiment will be described with reference to the drawings. FIG. 5 is a cross-sectional view schematically showing the light emitting device 400 according to the second embodiment. Hereinafter, in the light emitting device 400 according to the second embodiment, the members having substantially the same functions as those of the constituent members of the light emitting device 100 according to the first embodiment described above will be denoted by the same reference symbols, and the detailed descriptions thereof will be omitted.

As shown in FIG. 1, in the light emitting device 100 described above, the excitation light source 102 irradiates the second surface 12b of the substrate 10 with the excitation light L0, and the light emitting layer 34 is irradiated with the excitation light L0 transmitted through the substrate 10.

In contrast, in the light emitting device 400, the excitation light source 102 obliquely irradiates the light emitting layer 34 with the excitation light L0 as shown in FIG. 5. The light axis of the excitation light L0 is tilted with respect to the normal line N of the first surface 12a of the substrate 10. The light emitting layer 34 is irradiated with the excitation light L0 which is emitted from the excitation light source 102 and is then transmitted through the second electrode 52. The wavelength of the excitation light L0 and the wavelength of the laser beam L2 can be different from each other, or can also be the same as each other.

In the light emitting device 400, similarly to the light emitting device 100, since the light emitting layer 34 generates the light due to the electrical current injected from the electrodes 50, 52 and the excitation light L0, the amount of the injection current can be reduced compared to when generating the light due only to the electrical current injected from the electrodes 50, 52. Therefore, in the light emitting device 400, the heat generated while being activated can be reduced.

It should be noted that although in the example shown in FIG. 5, the photonic crystal structure 24 varies the refractive index at the pitch equal to or shorter than the wavelength of the light using the plurality of columnar parts 30, it is also possible to vary the refractive index at the pitch equal to or shorter than the wavelength of the light using the plurality of opening parts 302 as shown in FIG. 4.

3. Third Embodiment

Figure 6:
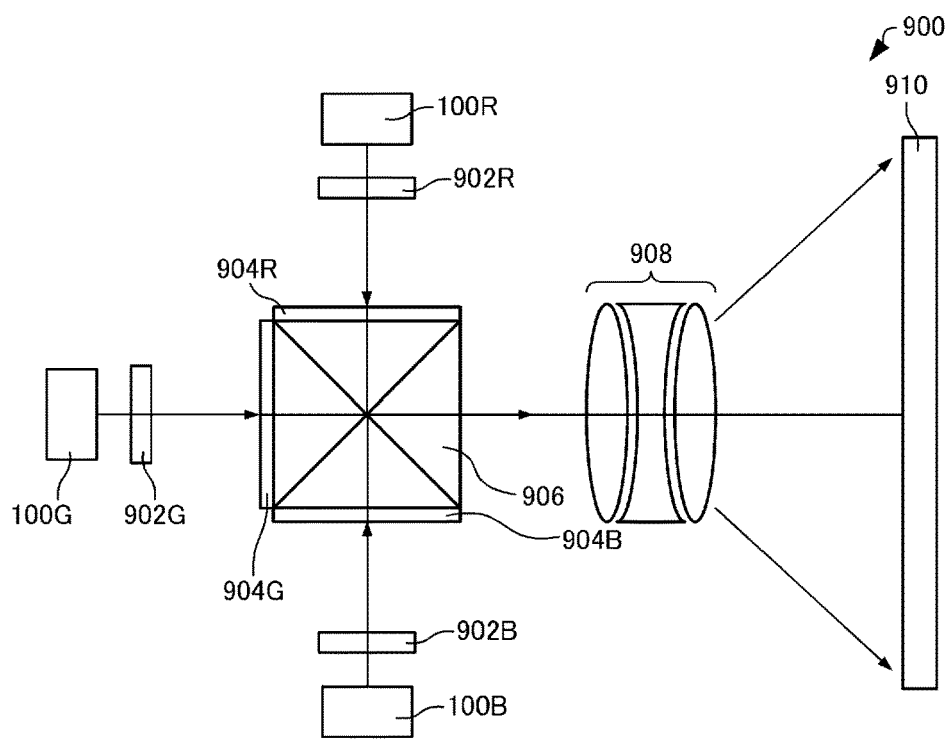
FIG. 6 is a diagram schematically showing a projector according to a third embodiment.

Then, a projector according to a third embodiment will be described with reference to the drawings. FIG. 6 is a diagram schematically showing the projector 900 according to the third embodiment.

The projector 900 has, for example, the light emitting device 100 as a light source.

The projector 900 includes a housing not shown, a red light source 100R, a green light source 100G, and a blue light source 100B which are disposed inside the housing, and respectively emit red light, green light, and blue light. It should be noted that in FIG. 6, the red light source 100R, the green light source 100G, and the blue light source 100B are simplified for the sake of convenience.

The projector 900 further includes a first optical element 902R, a second optical element 902G, a third optical element 902B, a first light modulation device 904R, a second light modulation device 904G, a third light modulation device 904B, and a projection device 908 all installed inside the housing. The first light modulation device 904R, the second light modulation device 904G, and the third light modulation device 904B are each, for example, a transmissive liquid crystal light valve. The projection device 908 is, for example, a projection lens.

The light emitted from the red light source 100R enters the first optical element 902R. The light emitted from the red light source 100R is collected by the first optical element 902R. It should be noted that the first optical element 902R can be provided with other functions than the light collection. The same applies to the second optical element 902G and the third optical element 902B described later.

The light collected by the first optical element 902R enters the first light modulation device 904R. The first light modulation device 904R modulates the incident light in accordance with image information. Then, the projection device 908 projects an image formed by the first light modulation device 904R on a screen 910 in an enlarged manner.

The light emitted from the green light source 100G enters the second optical element 902G. The light emitted from the green light source 100G is collected by the second optical element 902G.

The light collected by the second optical element 902G enters the second light modulation device 904G. The second light modulation device 904G modulates the incident light in accordance with the image information. Then, the projection device 908 projects an image formed by the second light modulation device 904G on the screen 910 in an enlarged manner.

The light emitted from the blue light source 100B enters the third optical element 902B. The light emitted from the blue light source 100B is collected by the third optical element 902B.

The light collected by the third optical element 902B enters the third light modulation device 904B. The third light modulation device 904B modulates the incident light in accordance with the image information. Then, the projection device 908 projects an image formed by the third light modulation device 904B on the screen 910 in an enlarged manner.

Further, it is possible for the projector 900 to include a cross dichroic prism 906 for combining the light emitted from the first light modulation device 904R, the light emitted from the second light modulation device 904G, and the light emitted from the third light modulation device 904B with each other to guide the light thus combined to the projection device 908.

The three colors of light respectively modulated by the first light modulation device 904R, the second light modulation device 904G, and the third light modulation device 904B enter the cross dichroic prism 906. The cross dichroic prism 906 is formed by bonding four rectangular prisms to each other, and is provided with a dielectric multilayer film for reflecting the red light and a dielectric multilayer film for reflecting the blue light disposed on the inside surfaces. The three colors of light are combined with each other by these dielectric multilayer films, and thus, the light representing a color image is formed. Then, the light thus combined is projected on the screen 910 by the projection device 908, and thus, an enlarged image is displayed.

It should be noted that it is possible for the red light source 100R, the green light source 100G, and the blue light source 100B to directly form the images by controlling the light emitting devices 100 as the pixels of the image in accordance with the image information without using the first light modulation device 904R, the second light modulation device 904G, and the third light modulation device 904B. Then, it is also possible for the projection device 908 to project the images formed by the red light source 100R, the green light source 100G, and the blue light source 100B on the screen 910 in an enlarged manner.

Further, although the transmissive liquid crystal light valves are used as the light modulation devices in the example described above, it is also possible to use light valves other than the liquid crystal light valves, or to use reflective light valves. As such light valves, there can be cited, for example, reflective liquid crystal light valves and Digital Micromirror Device™. Further, the configuration of the projection device is appropriately modified in accordance with the type of the light valves used.

Further, it is also possible to apply the light source to a light source device of a scanning type image display device having a scanning unit as an image forming device for scanning the surface of the screen with the light from the light source to thereby display an image with a desired size on the display surface.

The light emitting devices according to the embodiments described above can also be used for other devices than projectors. As the applications other than projectors, there can be cited, for example, a light source of indoor and outdoor illumination, a backlight for a display, a laser printer, a scanner, an in-car light, sensing equipment using light, communication equipment, and so on.

In the present disclosure, some of the constituents can be omitted, or the embodiments and the modified example can be combined with each other within a range in which the features and the advantages described in the specification are provided.

The present disclosure is not limited to the embodiments described above, but can further variously be modified. For example, the present disclosure includes substantially the same configuration as the configurations described in the embodiments. Substantially the same configuration means a configuration substantially the same in, for example, function, way, and result, or a configuration substantially the same in object and advantage. Further, the present disclosure includes configurations obtained by replacing a non-essential part of the configuration explained in the above description of the embodiments. Further, the present disclosure includes configurations providing the same functions and the same advantages, or configurations capable of achieving the same object as those of the configuration explained in the description of the embodiments. Further, the present disclosure includes configurations obtained by adding a known technology to the configuration explained in the description of the embodiments.

What is claimed is:

1. A light emitting device comprising:
an excitation light source; and
a light emitting light source, wherein
the light emitting light source includes
a substrate,
a photonic crystal structure which is provided to the substrate and has a light emitting layer, and
an electrode configured to inject an electrical current into the light emitting layer,
the excitation light source irradiates the light emitting layer with excitation light,
the light emitting layer generates light due to the electrical current injected from the electrode and the excitation light, and
in the photonic crystal structure, the light emitted in the light emitting layer resonates in an in-plane direction of the substrate, and a laser beam is emitted in a normal direction of the substrate.

2. The light emitting device according to claim 1, wherein
the excitation light source irradiates a surface at an opposite side of the substrate to a side to which the photonic crystal structure is provided with the excitation light, and
the light emitting layer is irradiated with the excitation light transmitted through the substrate.

3. The light emitting device according to claim 2, wherein
a light axis of the excitation light entering the light emitting layer and a light axis of the laser beam are parallel to each other.

4. The light emitting device according to claim 2, further comprising:

a wavelength-selective film which is configured to transmit the excitation light and reflect the laser beam, and is disposed between the photonic crystal structure and the excitation light source.

5. The light emitting device according to claim 1, wherein a wavelength of the excitation light and a wavelength of the laser beam are same as each other.

6. The light emitting device according to claim 1, wherein a wavelength of the excitation light and a wavelength of the laser beam are different from each other.

7. A projector comprising:
the light emitting device according to claim 1.

\* \* \* \* \*